United States Patent [19]

Takimoto

[11] 4,269,489
[45] May 26, 1981

[54] CAMERA AND ERROR PREVENTING CIRCUIT THEREFOR

[75] Inventor: Hiroyuki Takimoto, Urawa, Japan

[73] Assignee: Canon Kabushiki Kaisha, Tokyo, Japan

[21] Appl. No.: 72,665

[22] Filed: Sep. 5, 1979

[30] Foreign Application Priority Data

Sep. 8, 1978 [JP] Japan ................................ 53-111061

[51] Int. Cl.³ .......................... G03B 1/00; G03B 17/38
[52] U.S. Cl. ..................................... 352/174; 352/170; 354/268
[58] Field of Search ................. 354/230, 266, 267, 268, 354/60R; 352/22, 170, 171, 174, 176, 178; 320/13, 40, 48; 340/660, 661, 663, 636

[56] References Cited

U.S. PATENT DOCUMENTS

| 3,568,175 | 2/1971 | Schwehr | 320/48 |
| 3,979,657 | 9/1976 | Yorksie | 320/13 |
| 4,084,891 | 4/1978 | Kiefer | 352/174 |
| 4,114,173 | 12/1978 | Tezuka et al. | 354/268 X |

Primary Examiner—L. T. Hix
Assistant Examiner—William B. Perkey
Attorney, Agent, or Firm—Toren, McGeady and Stanger

[57] ABSTRACT

In the camera disclosed, an error preventing circuit responds to a drop in the electrical power source or battery and deactivates the camera control elements in the same sequence as that used when the camera release operation ends. According to an embodiment, the error preventing circuit also prevents the start sequence from beginning in response to a low source voltage. This assures satisfactory control over initiation and termination of each camera operating cycle and assures proper stopping when the battery voltage falls below the satisfactory operating level.

5 Claims, 22 Drawing Figures

CAMERA AND ERROR PREVENTING CIRCUIT THEREFOR

BACKGROUND OF THE INVENTION

1. Field of the Invention

This invention relates to cameras, such as movie cameras and, particularly, to circuits for preventing faulty operation when the battery voltage falls.

2. Description of the Prior Art

Cameras with circuits for preventing faulty operation due to a drop in the battery voltage are known. Such circuits are used in the circuitry for controlling the operation of a cine camera and constructed in the form of a warning circuit using an indicator, such as an LED, that lights upon the fall of the battery voltage, or a switching circuit that responds to the fall of the battery voltage and cuts off the electrical power supply. Such conventional error preventing, i.e., faulty operation preventing, circuits are rendered effective just as soon as the battery voltage drops below the satisfactory operating level. This may result in a serious disadvantage, namely the circuit may respond with a warning or cut off the control when the effective voltage of the battery is only temporarily lowered, for example, due to a sudden increase of the load current. Specifically, the operation of a cine camera begins by supplying electrical power to the diaphragm control circuit and, after the diaphragm control is stabilized, proceeds to drive the film motor. Supplying a large current to the diaphragm control circuit temporarily lowers the battery voltage. A conventional circuit tends to cut off the electrical power supply in response to the temporary lowering of the battery voltage. Thus, even when the battery voltage recovers the satisfactory exposure operating level, the motor is no longer supplied with electrical power.

Another disadvantage of conventional circuits is that the error preventing operation occurring when the battery voltage falls is effected by merely opening the power switch to terminate the application of electric power supplied to all the circuit portions, so that the camera control circuit stops controlling the operation of the camera even in the middle of a cycle during the pulldown operation of the claw. In other words, for example, in the sequence control circuit of a sound motion picture camera, the actuation of release initiates an exposure not directly but through various control members driven in sequence according to a predetermined program. To terminate the exposure, the camera must be stopped according to a given sequence, or otherwise the rotary shutter would be left open. Accordingly, if the drop in battery voltage occurs during an exposure, it is then necessary to extend application of the electrical power supply until the concurrent exposure terminating sequence has been completed. Alternately, when a drop is detected at the time the release is actuated, the electrical power supplied to the shutter control circuit should be instantly cut off, because the exposure aperture is still closed.

SUMMARY OF THE INVENTION

An object of the present invention is to provide a circuit for preventing faulty operation of a camera when the voltage of an electrical power source is temporarily lowered, while permitting the voltage to be checked accurately so that when a voltage drop continues, a deactuating signal is produced to stop the camera from further operation.

Another object of the present invention is to provide a circuit for preventing faulty operation of a cine camera by controlling the stoppage of electrical power in accordance with the operating phase of a camera cycle in which the voltage drop is detected in such a manner that the operation of the camera is stopped.

The various features of the invention are pointed out in the claims. Other objects and advantages of the present invention will become apparent from the following detailed description of embodiments when taken in conjunction with the accompanying drawings.

DESCRIPTION OF PREFERRED EMBODIMENTS

Figure 1:
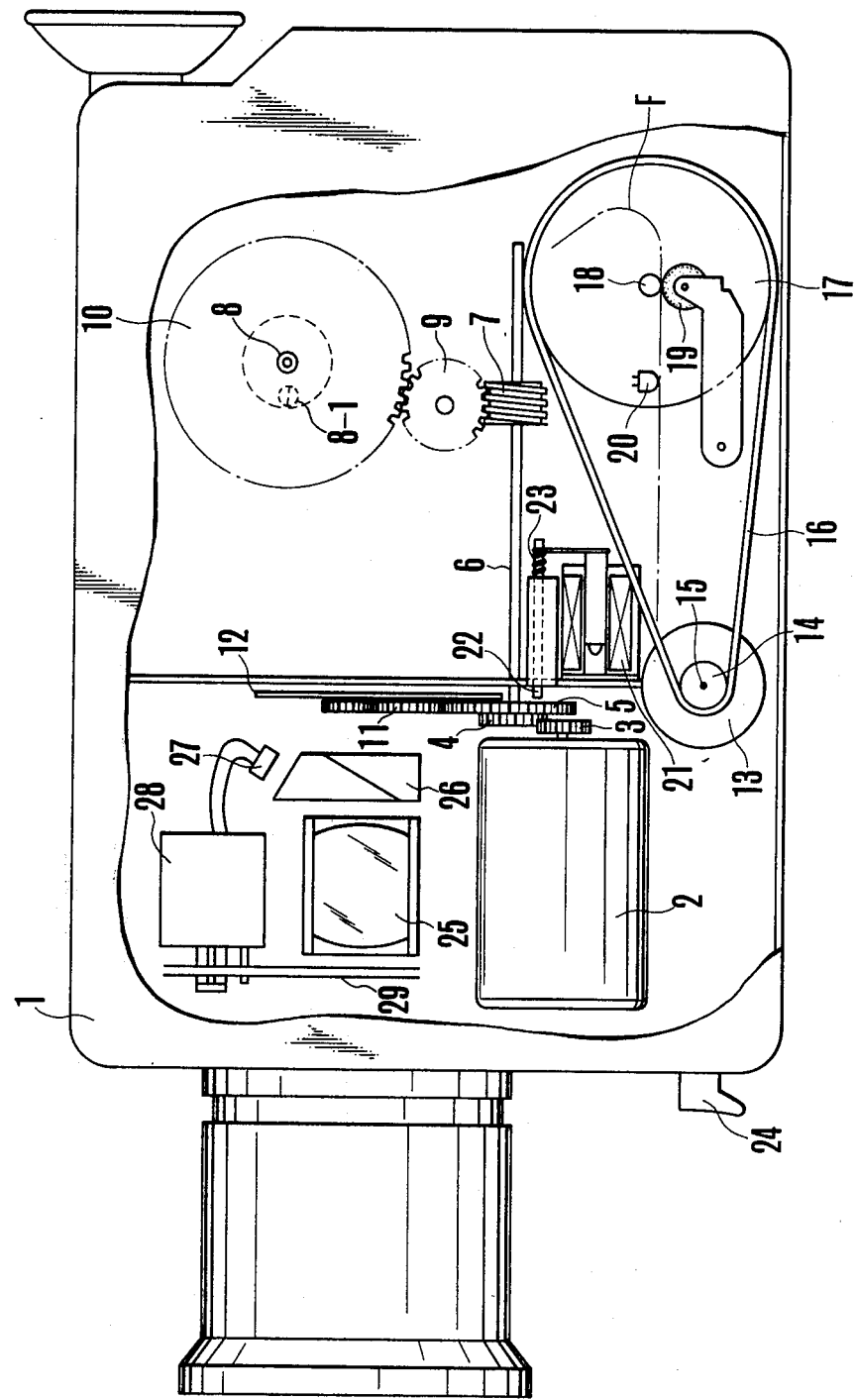
FIG. 1 is a side elevational view of a cine camera embodying the invention and incorporating an error preventing circuit.

FIG. 1 shows the outline of construction and arrangement of the main parts of a cine camera embodying the invention. Here, camera body 1 encloses a film drive motor 2. In the body, a gear 3 fixedly mounted on the rotary shaft of the motor 2 meshes with a gear 4 and forms a two-stage gear arrangement with a gear 5. A rotary shaft 6 in the two-stage arrangement has a worm gear 7 fixedly mounted thereon. A gear 9 meshing with the worm gear 7 drives a gear 10 which is connected to a takeup shaft 8 through a friction mechanism. The takeup shaft 8 carries a takeup pawl 8-1 arranged to engage a takeup spool of a film cartridge when the film cartridge is loaded into a cartridge chamber in the camera body.

A gear 11 meshes with the gear 5, and is connected to a shutter blade 12. The shutter blade 12 rotates in response to rotation of the gear 11. The camera further contains a capstan motor 13, a pulley 14 fixed to a rotary shaft 15 of the capstan motor 13, a motion transmission belt 16 trained between the pulley 15 and a pulley of a flywheel 17, a capstan shaft 18, a pinch roller 19, a sound recording magnetic head 20, and an electromagnet 21 for controlling movement of a stopper member 22. The stopper member 22 is arranged opposite an engagement groove provided in the gear 5 so as selectively to engage the engagement groove and inhibit rotation of the above described gear 5, and upon retraction from the engagement groove allows rotation of the gear 5. The shutter blade 12 is constructed so that when the gear 4 is latched by the stopper member 22 engaging the engagement groove, the exposure aperture is fully closed. A compression spring 23 urges the stopper member 22 away from the gear 5. Also included are a trigger lever 24, a relay lens 25, a prism 26 for light measurement, and a photo-sensitive element 27 whose output is utilized in determining the size of the aperture of diaphragm member 29. The output of element 27 also drives a diaphragm control circuit 28 including a meter or the like.

Figure 2:
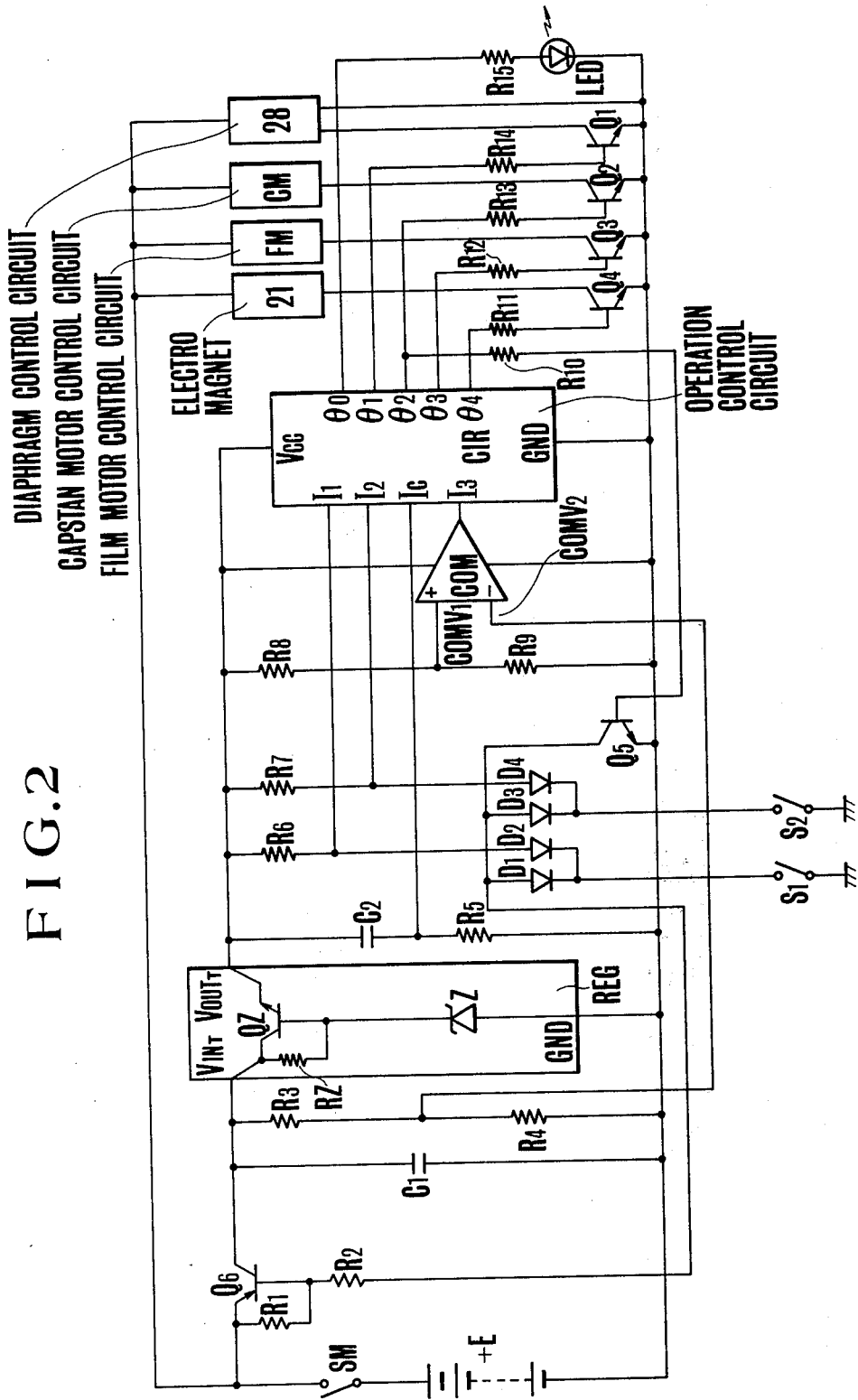
FIG. 2 is an electrical circuit diagram illustrating a sequence control circuit of the cine camera in FIG. 1 and embodying features of the invention.

FIG. 2 shows one embodiment of the faulty operation preventing circuit according to the present invention applied to a sequence control circuit of the cine camera. An electrical power source or battery E energizes the circuit through an electrical power source switch SM, and partially through an electrical power supply control transistor Q6 whose emitter is connected to the switch SM and whose collector is connected to an input terminal Vint of a regulator circuit REG. Shunting the emitter-base path of the transistor Q6 is a resistor R1. The base of the transistor Q6 is connected through a resistor R2 and diodes D1, D3 to two switches S1, S2. The switch S1 is turned on by the first step of a release lever 24 of FIG. 1, and the switch S2 is a switch that is closed by the second step of the release lever 24. A capacitor C1 is connected between the collector of the transistor Q6 and the negative terminal of the battery E, so that even after the power supply control transistor Q6 is turned off, the circuit is capable of supplying power.

Figure 5:
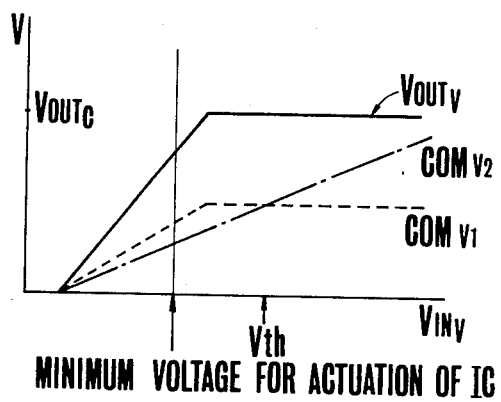
FIG. 5 is a graph showing the operation of the comparator COM of FIG. 2.

Resistors R3 and R4 connected in series to each other to form a battery voltage detecting resistor circuit is connected parallel to the capacitor C1 to produce an output proportional to the actual voltage of the battery E. The output at the junction of resistors R3 and R4 is applied to a negative input terminal of a comparator COM. The regulator circuit REG is constructed, for example, of a Zener diode Z, a resistor RZ and a transistor QZ, and is responsive to a voltage Vint applied to the input terminal Vint and produces a voltage Voutv appearing at an output terminal VoutT, as shown in FIG. 5. A capacitor C2 connected in series with a resistor R5 forms a power-up clear circuit therewith. The output terminal of the power-up clear circuit is connected to an input terminal Ic of an integrated circuit (IC) operation control circuit CIR.

A resistor R6 is connected through a diode D2 to the switch S1. The junction of the resistor R6 and the diode D2 is connected to an input terminal I1 of the circuit CIR. A resistor R7 is connected through a diode D4 to the switch S2. The junction point of the resistor R7 and the diode D4 is connected to an input terminal I2 of the circuit CIR. Two resistors R8 and R9 form a voltage divider for dividing the output voltage Voutv of the regulator circuit REG to form a reference voltage COMV1. The comparator COM has an output terminal connected to an input terminal I3 of the circuit CIR. The threshold level for inverting the comparator COM is preadjusted to a voltage Vth somewhat higher than the lower operating level of the control circuit CIR.

Figure 7:
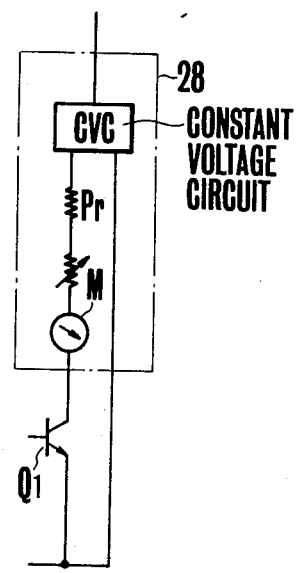
FIG. 7 is a diagram of an example of the diaphragm control circuit of FIG. 2.

A transistor Q1 has its base connected through a resistor R14 to an output terminal O1 of the circuit CIR and its collector connected to a diaphragm control circuit 28 which controls the diaphragm on the basis of the brightness of an object being photographed. Thus, the transistor Q1 serves to control the power to the diaphragm control circuit 28. The latter, as shown in FIG. 7, is composed of a constant voltage circuit CVC, a photosensitive element Pr and a meter M whose pointer is translated into the diaphragm aperture.

A transistor Q2 has its base connected through a resistor R13 to an output terminal O2 of the circuit CIR and its collector connected to a capstan motor control circuit CM known in the art of synchronous sound recording cine cameras. A transistor Q3 has its base connected through a resistor R12 to an output terminal O3 of the circuit CIR and its collector connected to a film motor control circuit FM. A transistor Q4 has its base connected through a resistor R11 to an output terminal O4 of the circuit CIR and its collector connected to the electromagnet 21 controlling the operation of the stopper member so that the shutter is latched in the exposure aperture closing position.

A light-emitting diode LED connected through a resistor R15 to an output terminal Oo of the circuit CIR emits light when the battery voltage falls to inform the operator of the fact that the battery is no longer usable. A transistor Q5 has its collector connected to the base of the transistor Q6 and its base connected to an output terminal O2 of the circuit CIR. The transistor Q5 serves to control the power through the transistor Q6.

Figure 3:
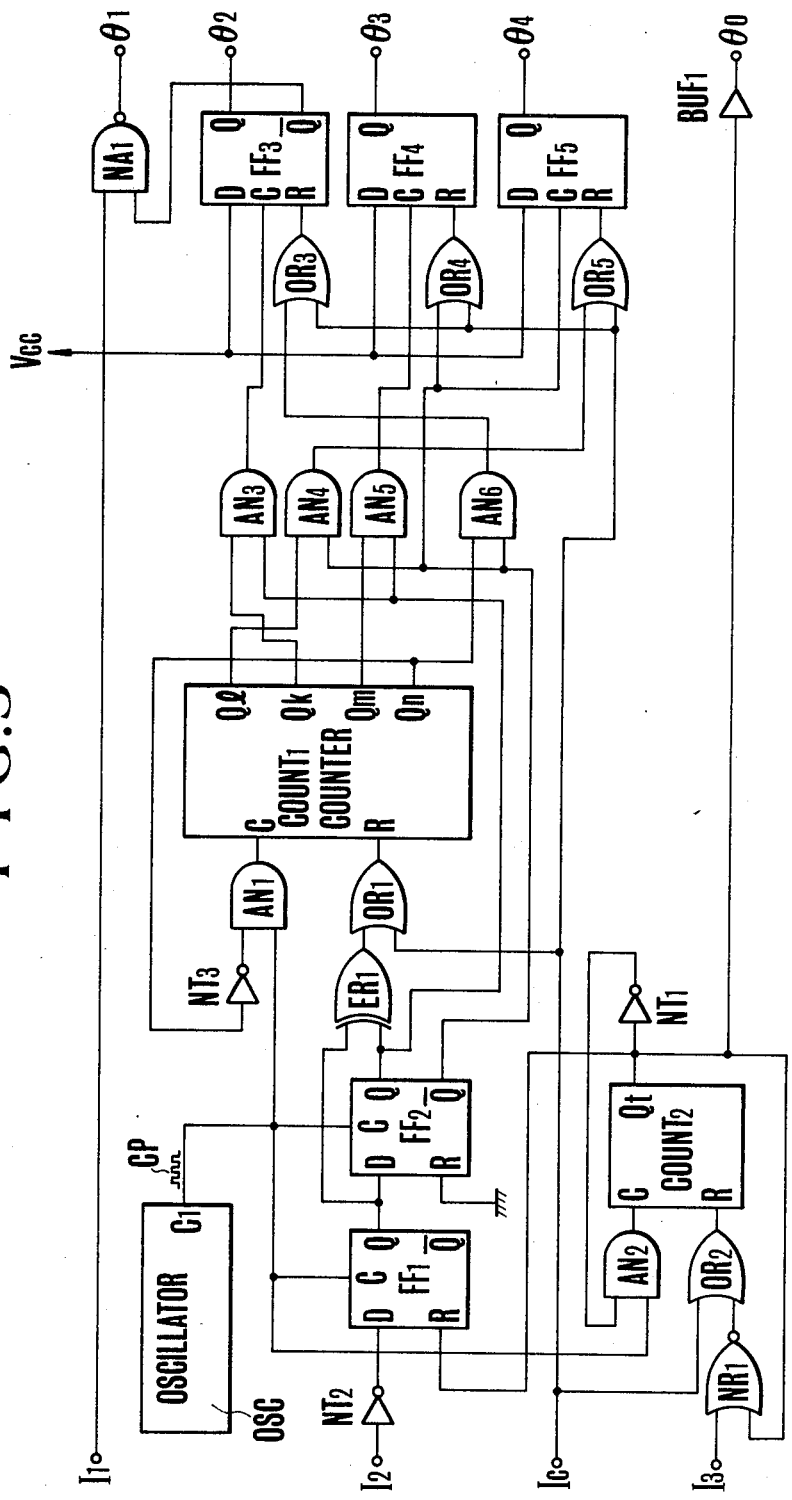
FIG. 3 is an electrical circuit diagram showing the details of the circuit of FIG. 2.

FIG. 3 shows details of a preferred embodiment of the control circuit CIR of FIG. 2. Here, a pulse generator OSC produces a clock pulse train CP. A D-type flip-flop FF1 has a D input connected through an inverter NT2 to the input terminal I2 and has an output terminal Q connected to the D input terminal of a D-type flip-flop FF2 and to one of the inputs of an exclusive OR gate ER1. The second flip-flop FF2 has an output terminal Q connected to the other input of the exclusive OR gate ER1. Said flip-flops FF1, FF2 and exclusive OR gate ER1 constitute a pulse forming circuit for producing a pulse which actuates sequence control operation for initiation and termination of an exposure.

An OR gate OR1 connects a reset terminal R of a counter COUNT1 to the output of the exclusive OR gate ER1 and to the input terminal Ic. Hence, the counter COUNT1 is reset by a pulse from said gate ER1 or the power-up clear pulse from the input terminal Ic. An inverter NT3 has an input connected to an output terminal Qn of the counter COUNT1 and a terminal connected to one input of an AND gate AN1. Thus, the AND gate AN1 is gated off by a high signal from the output terminal Qn of the counter COUNT1, to terminate the duration of the counting operation for the clock pulses CP entering the AND gate AN1. During the counting operation, the counter COUNT1 first produces a high signal at an output terminal Ql, and then at output terminal Qk, Qm, Qn, in sequence. An AND gate AN3 receives one input from the output terminal Qk of the counter COUNT1 and at the other input from the output terminal Q of the flip-flop FF2. The AND gate AN3 applies its output to the clock terminal C of a D-type flip-flop FF3 and produces a signal which sets the flip-flop FF3.

An AND gate AN4 receives one input from the output terminal Ql of the counter COUNT1 and another input from the $\overline{Q}$ output terminal of the flip-flop FF2. The AND gate AN4 applies its output through an OR gate OR5 to the reset terminal R of a D-type flip-flop FF5 and produces a signal for resetting said flip-flop FF5. An AND gate AN5 is connected at one input to the output terminal Qm of the counter COUNT1 and at the other input to the Q output of the flip-flop FF2. The output of the AND gate AN5 is connected to the clock terminal C of a D-type flip-flop FF4 and produces a signal for setting said flip-flop FF4. An AND gate AN5 is connected at one input to the output Qn of counter COUNT1 and at the other input to the $\overline{Q}$ output of the flip-flop FF2. The output of the AND gate AN6 is connected through an OR gate OR3 to the reset terminal R of a flip-flop FF5 and produces a signal for resetting said flip-flop FF5.

A NAND gate NA1 has its input terminal connected to the input terminal I1 and the $\overline{Q}$ output terminal of the flip-flop FF3 and its output terminal connected to the output terminal O1 of the circuit CIR. A counter COUNT2 has a reset terminal R connected through an OR gate OR2 to the input terminal Ic and the output of a NOR gate NR1, and thus is reset by a high signal from the OR gate OR2. The clock input terminal C of said counter COUNT2 receives signals from an output of an AND gate AN2, one of whose inputs is connected to an inverter NT1 and the other of whose inputs is connected to the abovedescribed pulse oscillator OSC. The counter COUNT2 starts to count when the battery voltage drops, and serves as a timer circuit for producing a high signal from an output terminal Qt after a predetermined time interval. A buffer amplifier BUF1 is connected to the output terminal Qt of the counter COUNT2.

Figure 4:
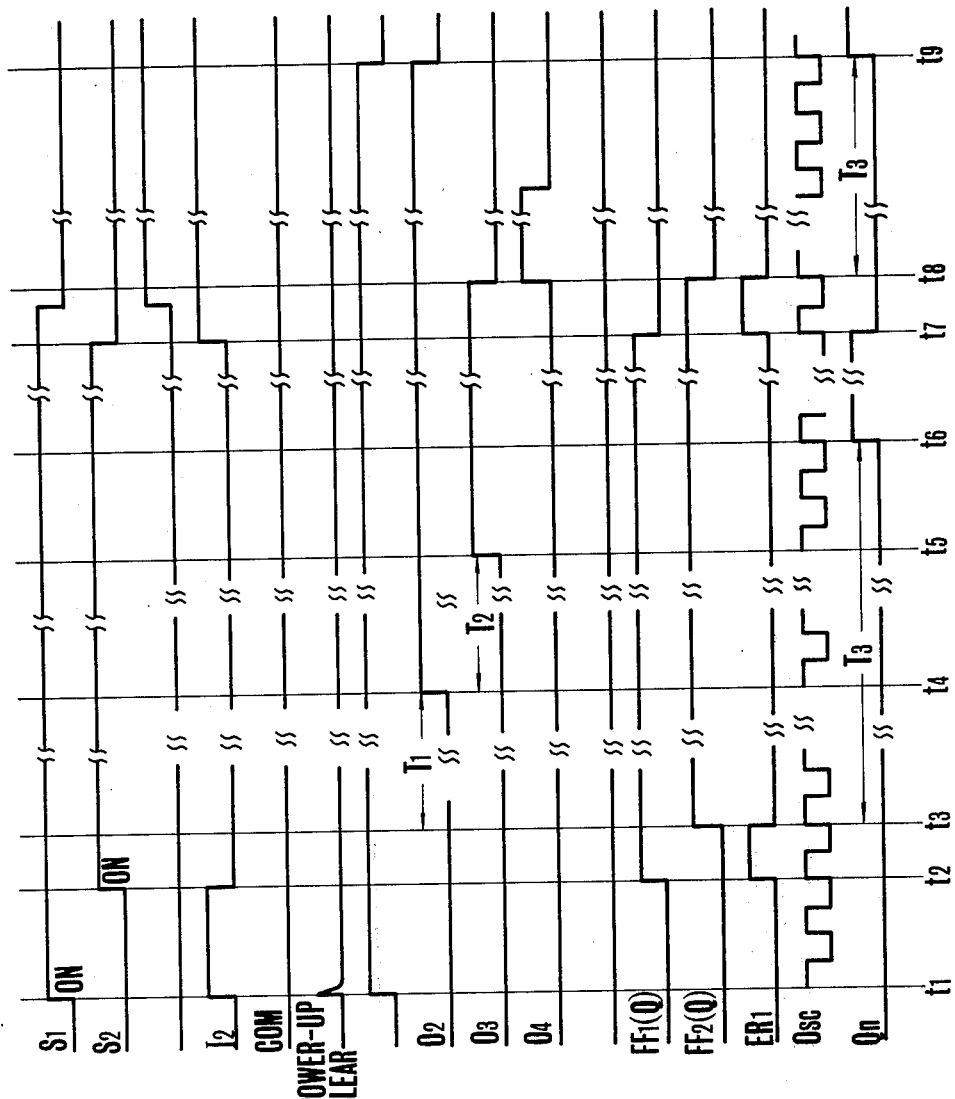
FIGS. 4a to 4p are voltage timing diagrams illustrating the manner in which the sequence control circuit of FIGS. 2 and 3 may operate.

The operation of the circuitry of the cine camera of FIGS. 1 to 3 will become clearer when referring to FIGS. 4a to 4p and 5. In normal operation, an operator first closes the power switch SM, and then depresses the release lever 24. At the first step of the release action, as the release lever 24 is depressed, the switch S1, at the time $t_1$ shown in FIG. 4a, is turned on. This then turns on the transistor Q6 which applies the voltage of the battery E to the input terminal Vint of the regulator circuit REG. If it is assumed that the actual voltage of the battery E is sufficiently high, the regulator circuit REG produces an output in the form of a regulated voltage Voutc appearing at the output terminal VoutT. This output voltage renders the sequence control circuit CIR operative.

Since the switch S1 is now closed, a low signal (hereinafter referred to as "0" or a low signal) is applied to the input terminal I1. Since the switch S2 is not yet closed, a high signal (hereinafter referred to as "1" or a high signal) is applied to the input terminal I2. The input terminal Ic receives a signal pulse from the power-up clear circuit, and the input terminal I3 receives the output signal of the comparator COM.

As mentioned above, since the battery E has a sufficiently high voltage, the constant voltage COMV1 at the positive input terminal of the comparator COM is exceeded by the voltage COMV2 on the negative input terminal. This causes the comparator COM to produce a "0" signal which is applied to the input terminal I3. Because the input terminal I1 receives a "0" signal as mentioned, the NAND gate NA1 produces a "1" signal which appears at the output terminal O1. This turns on the transistor Q1 and renders the diaphragm control circuit 28 of known construction operative. Adjustment of the size of the diaphragm aperture opening according to the object brightness is now initiated.

At the time $t_1$, the power-up clear circuit produces a single pulse which appears at the input terminal Ic. The flip-flops FF3-FF5 remain reset and produce "0" signals at the output terminals Q. The resulting lows at the outputs 02-04 keep the transistor Q2-Q4 in the nonconductive state. Also, the pulse from the power-up clear circuit occurring at the time $t_1$ is transmitted through the OR gate OR2 to the counter COUNT2 at its reset terminal R, and the counter is thus reset. For this reason, at the time $t_1$, the counter COUNT2 produces a "0" signal.

The NOR gate NR1 receives the "0" signal from the counter COUNT2 and also a "0" signal, shown in FIG. 4e, from the input terminal I3 to produce a "1" signal. For this reason, the counter COUNT2 continues to be reset and, therefore, the output of the counter COUNT2 is maintained at "0", so that the light-emitting diode LED is left de-energized. Until the first step or stage, only the diaphragm control circuit 28 is rendered operative.

Upon further depression of the release lever to a second step, the switch S2 is turned on. At the time $t_2$ at which the switch S2 is closed, the circuit CIR receives a "0" at its input terminal I2. This low is then inverted by the inverter NT2 of FIG. 3 and applied to the D terminal of the flip-flop FF1. Then, the flip-flop FF1 produces a "1" signal in synchronism with the clock pulse CP from the oscillator OSC as shown in FIG. 4l, and this signal is directed to the D input terminal of the flip-flop FF2. For this reason, the flip-flop FF2 is set one clock pulse later, after the flip-flop FF1 has been set and produces a "1" signal as shown in FIG. 4m. This causes the exclusive OR gate ER1 to produce a signal pulse as shown in FIG. 4n which is applied to the reset terminal R of the counter COUNT1.

When the counter COUNT1 is reset, its output terminals Qk, Ql, Qm and Qn produce "0" signals. The "0" output at Qn, after having been inverted to a "1" signal by the inverter NT3 is applied to the AND gate AN1 at one input thereof. Thus, the AND gate AN1 is gated on from a time $t_3$ onward at which the counter COUNT1 was reset, and the clock pulses from the oscillator OSC are passed through the AND gate AN1 to the clock terminal C of the counter COUNT1.

When the number of clock pulses counted by the counter COUNT1 has reached a predetermined value, a "1" signal is produced at the output Ql. Then, when the counter COUNT1 has advanced an additional predetermined number of clock pulses, the output terminal Qk produces a "1" signal which is applied to the AND gate AN3 at one input thereof. Since the other input of the AND gate AN3 is connected to the output terminal Q of the flip-flop FF2, and the output Q is "1" as shown in FIG. 4m, the AND gate AN3 produces a "1" signal. For this reason, the flip-flop FF3 is set at a predetermined time interval T1 from the time $t_3$ at which the counter COUNT1 starts to count, and produces a "1" signal from the output terminal Q.

At the time $t_4$ after the predetermined time interval T1 from the time $t_3$, a "1" signal appears at the output terminal O2 of the circuit CIR as shown in FIG. 4h. This turns on the transistor Q2 to render the capstan motor control circuit CM operative. Thus, the capstan motor 13 of FIG. 1 starts to rotate.

When the counter COUNT1 has counted more pulses, a "1" signal is produced at the output terminal Qm of the counter COUNT1. This high is fed to one input of the AND gate AN5 whose other input is connected to the Q high output of the set flip-flop FF2. Thus, AND gate AN5 produces a "1" signal in response to the "1" signal from the output terminal Qm of the counter COUNT1. The "1" signal from the AND gate AN5 sets the flip-flop FF4 to produce an output Q of "1" level. Therefore, after the elapse of an additional predetermined time T2 from the time $t_4$ at which the counter COUNT1 produces a "1" at the output Qk, that is, at a time $t_5$, a "1" signal is produced at the output terminal O3 of the circuit CIR as shown in FIG. 4i. This causes the transistor Q3 to conduct and render the film motor drive control circuit FM operative. The film motor 2 now starts to rotate and drive the film transporting mechanism and rotary shutter.

Since the actuation of the film motor drive control circuit FM is delayed from the actuation of the capstan motor by the time interval T2, even when a slack loop of film in the loaded cartridge amounts to several frames of film, advancement of the film is always initiated from a condition in which this slack loop of several frames is removed. From the time $t_5$ onward, motion pictures with sound accompaniment are being taken on the sound film.

Even after the time $t_5$, the counter COUNT1 advances until a predetermined number of additional pulses have been counted at a time $t_6$ (after a time $t_3$ from the start of counting operation by the counter COUNT1) to produce a "1" signal at an output Qn as shown in FIG. 4p. Then, responsive to the signal, the inverter NT3 produces a "0" signal which is applied to the input terminal of the AND gate AN1. Thus, the counting operation of the counter COUNT1 is terminated, and the control scheme of the circuit CIR for initiation of the exposure has been fulfilled.

During termination of the motion picture taking operation, the circuit CIR operates as follows. Assuming that the operator removes his finger from the release lever at a time $T_7$, the switch S2 is then turned off as shown in FIG. 4b, and the input at the terminal I2 is changed to "1" as shown in FIG. 4d. Therefore, the inverter NT2 of FIG. 3 produces a "0" signal which is applied to the D input terminal of the flip-flop FF1. The flip-flop FF1 is then reset by the clock pulse CP to produce a "0" signal as shown in FIG. 1. Therefore, in a manner similar to that described, the flip-flop FF2 is reset one clock pulse later to produce a "0" signal at a time $t_8$. Then, the exclusive OR gate ER1 produces a single pulse whose duration is equal to one period of clock pulses as shown in FIG. 4n. This pulse is fed through the OR gate OR1 to the reset input R of the counter COUNT1 so that the counter COUNT1 is now reset.

Accordingly, at the time point $t_7$, the output Qn of the counter COUNT1 is changed from "1" to "0" as shown in FIG. 4p. This causes the AND gate AN1 to be gated on again, and therefore, causes the counter COUNT1 to start counting clock pulses again. Also in this case, the flip-flop FF2 is reset at the time $t_8$ as shown in FIG. 4m to produce at the output $\overline{Q}$, a "1" which is applied through the OR gat OR4 to the reset terminal R of the flip-flop FF4. Therefore, the flip-flop FF4 is reset at the time $t_8$ causing the circuit CIR to produce a "0" signal at the output terminal O3, and therefore, causes the transistor Q3 to be turned off. Thus, the power supply to the film motor control circuit FM is cut off to stop further movement of the film.

On the other hand, the $\overline{Q}$ output of the flip-flop FF2 is fed to the clock terminal C of the flip-flop FF5. Hence the flip-flop FF5 is set at the time $t_8$, causing the circuit CIR to produce a "1" signal at its output terminal O4, and therefore, causes the transistor Q4 to turn on and energize the electromagnet 21.

The energized electromagnet 21 moves the stopper member 22 toward the gear 5 against the force of the spring 23. When the stopper member 22 engages the groove of the gear 5, the gear 5 is stopped and does not rotate further. Thus, the shutter blade 21 is latched in the exposure aperture in the fully closed position.

After the shutter is closed in this way, as the counter COUNT1 advances, its output terminal Q1 produces a "1" signal. At this time, because the flip-flop FF2 is reset, and the flip-flop FF2 produces a "1" at the output $\overline{Q}$, the AND gate AN4 responds to and produces a "1" signal. The flip-flop FF5 is now reset by said "1" signal from the OR gate OR5, causing the circuit CIR to produce a "0" signal at its output terminal O4. This turns off the transistor Q4 which de-energizes the electromagnet 21, so that the stopper member 22 is returned to its initial position.

After that, as the counter COUNT1 advances, the outputs Qk, Qm and Qn of the counter COUNT1 change to "1" signals in sequence. Since, at this time, the flip-flop FF2 is reset, the output of the circuit CIR is not changed by the "1" signal from the terminals Qk and Qm. At a time $t_9$ at which the output Qn changes to "1", that is, when a time interval T3, from the start of counting operation by the counter COUNT1 has passed, the AND gate AN6 produces a "1" signal in response to the output Qn of "1",25 and this "1" signal is applied through the OR gate OR3 to the flip-flop FF3. Therefore, at the time $t_9$, the flip-flop FF3 is reset, causing the circuit CIR to produce a "0" signal at the output terminal O2, and causes the transistor Q2 to turn off. Thus, the power supply to the capstan motor control circuit is cut off to stop the motor from further rotation. It is to be understood that the stoppage of the capstan motor is effected in the predetermined time interval T3 from the time the film motor is stopped. This insures that even when the film was slack, upt to several frames, at the time the film motor was stopped, the film is set to the normal state where the length of looped film between the exposure aperture and the sound head is minimized when the exposure operation is terminated. This is so because the prolonged rotation of the capstan motor feeds the part of the film which is slack. At this time, the flip-flop FF3 also produces a "1" at output $\overline{Q}$. If the switch S1 is concurrently off and, therefore, the input at the terminal I1 is "1", the NAND gate NA1 produces a "0" signal for the first time. This causes the circuit CIR to produce a "0" signal at the output terminal O1. Hence the transistor Q1 is turned off, with the resultant deactuation of the diaphragm control circuit 28. Thus, the continuous succession of frame exposures is terminated.

It is to be noted that since the NAND gate NA1 continues to produce a "1" signal, until the flip-flop FF3 is reset, even when the switch S1 is turned off, the diaphragm control circuit 28 is maintained in the operative condition until the scheme of sequential operation has been fulfilled. As described, the normal exposure operation is put into practice in the aforementioned sequence of various steps, provided that the voltage of the battery E is above the critical level.

If the battery voltage falls below the predetermined voltage Vth, the system operates as follows. It is assumed that an exposure is initiated by the ordinary sequence, and the circuit CIR produces "1" levels at outputs O1, O2 and O3 to actuate the diaphragm control circuit 28, capstan motor control circuit CM and the film motor control circuit FM for normal sound motion picture type operation. Now, the voltage of the battery E drops to such degree that the voltage Vinv applied to the input terminal Vint of the regulator circuit REG is lowered below the reference voltage Vth (FIG. 5). In this state, as shown by dashed lines, the input voltage COMV2 of the comparator COM becomes lower than COMV1, so that the comparator produces a "1" signal which is then applied to the circuit CIR at input terminal I3. Therefore, the NOR gate NR1 produces a "0" signal which is then applied to the counter COUNT2 at the reset terminal R. Hence, the counter COUNT2 is no longer reset.

The clock pulses CP are then passed through the AND gate AN2 to the clock terminal C of the counter COUNT2. The counter COUNT2 then starts to count the pulses CP. At a predetermined time, from the start of the counting operation, the counter COUNT2 changes its output Qt to "1" which, after having passed through the buffer amplifier BUF1 appears at the output terminal Oo. Thus, the light-emitting diode LED is lit to inform the operator that the battery voltage has fallen below a satisfactory operating level.

The "1" signal produced from the output terminal Qt of the counter COUNT2 is also applied to the reset terminal of the flip-flop FF1. Thus, the aforementioned procedure, after the time $t_7$ of FIG. 4 repeats itself, so that the shutter blade is latched in the exposure aperture closed position to terminate the exposure operation. It is to be understood that even when the battery voltage drops during an exposure, electric power to all circuits is not instantaneously stopped. Rather, after the exposure terminating operation has been completed in the ordinary sequence, the power supplied to all the circuits is cut off, thereby preventing the shutter blade from being latched in a position where the exposure aperture is left partially or completely open.

On the other hand, assuming that the battery E recovers and reaches the threshold level between the moment the counter COUNT2 starts to count and the time the counter COUNT2 produces a "1" signal at output Qt, the comparator COM then produces a "0" signal without delay. This resets the counter COUNT2 with the "1" signal of the NOR gate NR1. The flip-flop FF1 is then not reset, but remains in the set condition, permitting the aforementioned exposure cycle to continue. It will be appreciated that accidental or temporary drop in battery voltage does not affect the normal exposure nor, for example, does a sudden increase in the current load. The normal exposure cycle is terminated only when a continuous drop in battery voltage occurs.

Alternatively, the battery voltage may drop below the reference voltage Vth before actuation of the release. In that case, closure of the switch S1 by depressing the release to its first step, which turns on the transistor Q6 and which then turns on electrical power to the regulator circuit REG results in production of a "1" signal at the comparator COM. Thereafter, the counter COUNT2 starts to count and, after the predetermined time, produces a "1" signal at the output terminal Qt. Therefore, the flip-flop FF1 is maintained in the reset state so that even when the switch SW2 is turned on at the second step of the release, the flip-flop FF1 is not set, but remains in the reset state. Hence, the sequential actuation after the time $t_2$ of FIG. 4 does not occur, and only the diaphragm control circuit 28 is actuated. Thus, the otherwise resulting faulty operation due to the drop in voltage is prevented.

It should be noted that even in this case, when the battery recovers its normal voltage before the end of the time interval from the start of the counting operation of the counter COUNT2 to the "1" at the output Qt, that is, before the second step of the release has been effected, the counter COUNT2 is immediately reset so that the output Qt remains "0". Upon occurrence of the second step or stage of release, the exposure initiating sequence starts to operate. It will be appreciated that even when the battery voltage has dropped for a short time due to a large current for driving the diaphragm control circuit 28, the initiation of the exposure operation follows, provided that the threshold level for the battery voltage recovers before the second stage of the release. Thus, the correction for faulty operation due to the temporary drop of the battery voltage at the time of actuation of the diaphragm control circuit is inhibited. A voltage drop beyond the predetermined time produces the needed cut off.

Figure 6:
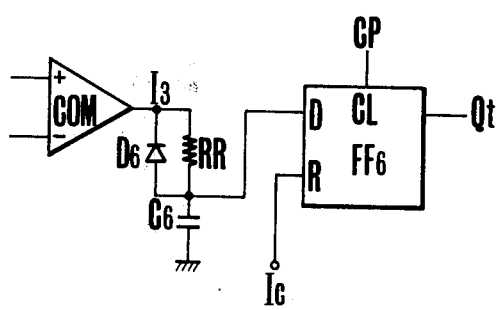
FIG. 6 is a diagram of another example of the timer circuit of FIG. 3.

FIG. 6 shows another example of the timer circuit comprising the counter COUNT2, AND gate AN2 and inverter NT2 of FIG. 3. The circuit here includes the comparator COM of FIG. 2, a resistor RR, and a capacitor C6. The capacitor C6 and the resistor RR form an integrating circuit which is actuated when the output of the comparator COM changes to "1". A D-type flip-flop FF has its D input terminal connected to the output terminal of the integrating circuit upon the output of said integrating circuit reaching a predetermined voltage to set the flip-flop FF2 in synchronism with the clock pulse CP applied to the clock terminal CL thereof and to produce a "1" signal from the output terminal Qt thereof. With such a construction, therefore, when the battery voltage drops below the predetermined level, the "1" signal from the input terminal I3 is integrated. If the battery voltage does not reach the normal voltage level during the predetermined time, the output terminal Qt produces a "1" signal. If, during this time interval, the normal battery voltage is regained, the charge so far stored on the capacitor C6 is discharged through the diode D6, thus the capacitor C6 is reset to effect an equivalent result to that of the timer of FIG. 3. The diaphragm control circuit 28 of FIG. 2 appears in FIG. 7.

As has been described in detail, the faulty operation preventing circuit of the present invention cuts off the electrical power supply to the various circuit portions in time-displaced relationship to each other which differ depending upon whether or not the release signal is present, when the drop in battery voltage lasts for a longer time than the predetermined time. This makes it possible to operate the cine camera with high reliability despite the temporary change of the battery voltage and to insure that the successive control of power supply to the various circuit portions facilitates minimal occurrences of faulty operation.

While embodiments of the present invention have been described in detail, it will be evident that the invention may be embodied otherwise without departing from its spirit and scope.

What is claimed is:
1. A camera, comprising:
 (a) release actuating means,
 (b) a plurality of camera elements,
 (c) a sequencing circuit connected to said camera elements for performing a photo-taking start sequence to actuate said camera elements with a prescribed timing to initiate a photo-taking operation, and a photo-taking stop sequence to place the camera elements in an inactive state with a prescribed timing to terminate a photo-taking operation, said sequencing circuit being arranged to carry out the start sequence in response to operation of said release actuating means and the stop sequence in response to discontinuing of the operation of said release actuating means,
(d) a detecting circuit for detecting a battery voltage and for producing a detection signal when said voltage drops below a prescribed level, and
(e) a distinguishing and control circuit for causing said sequencing circuit to carry out said stop sequence when the detection signal is produced while the release actuating means are operated, and for prohibiting the actuation of said start sequence when the detection signal is produced before the release actuating means is operated.

2. A camera, comprising:
(a) release actuating means,
(b) a plurality of camera elements,
(c) a signal forming circuit for forming a first output signal as said actuating means are operated and forming a second output signal as the operation of said actuating means is discontinued,
(d) a sequencing circuit connected to said camera elements,
said circuit having a start logic circuit and a stop logic circuit, said start logic circuit being arranged to actuate the camera elements following a prescribed sequence in response to said first output signal for initiating a photo-taking operation, and said stop logic circuit being arranged to place the camera elements in an inactive state following a prescribed sequence in response to said second output signal for terminating a photo-taking operation,
(e) a detecting circuit for detecting a battery voltage and for producing a detection signal when said voltage drops below a predetermined level, and
(f) a control circuit for causing said second output signal to be generated when said detection signal is produced while said release actuating means are operated, and for prohibiting generation of said first output signal when said detection signal is produced before the release actuating means is operated.

3. A camera, comprising:
(a) release actuating means,
(b) a plurality of camera elements,
(c) a signal forming circuit for forming a first output signal as said actuating means are operated and for forming a second output signal as the operation of said actuating means is discontinued,
(d) a sequencing circuit connected to said camera elements for actuating the camera elements with a prescribed timing in response to the first output signal for initiating a photo-taking operation, and placing the camera elements in an inactive state with a prescribed timing in response to the second output signal,
(e) a detecting circuit for detecting a battery voltage and for producing a detection signal when said voltage drops below a predetermined level, and
(f) a control circuit for preventing said signal forming circuit from responding to an operation of said actuating means when the detection signal is produced, and for converting the output of the signal forming circuit from the first output signal to the second output signal when the detecting circuit forms the detection output signal.

4. A camera according to any one of claims 1, 2, or 3, wherein said detecting circuit includes a timer circuit for establishing a predetermined timer period and producing a detection signal when a battery voltage remains below a predetermined level for a period of time longer than the timer period.

5. A camera, comprising:
(a) release actuating means,
(b) a plurality of camera elements,
(c) a sequencing circuit connected to said camera elements for producing a picture-taking start sequence to actuate said camera elements with a prescribed timing to initiate a picture-taking operation, and a picture-taking stop sequence to place the camera elements in an inactive state with a prescribed timing to terminate a picture-taking operation, said circuit being arranged to perform the start sequence in response to operation of said release actuating means and to perform the stop sequence in response to discontinuation of the operation of said release actuating means,
(d) a detecting circuit for detecting a battery voltage and for producing a detection signal when said voltage drops below a prescribed level, and
(e) control means to carry out the stop sequence by said sequencing circuit in response to the detection signal.

* * * * *